(12) United States Patent
Niwa et al.

(10) Patent No.: US 7,864,970 B2
(45) Date of Patent: Jan. 4, 2011

(54) VOLTAGE SUPPLY CIRCUIT AND MICROPHONE UNIT

(75) Inventors: Fumiyuki Niwa, Shiga (JP); Masayuki Ida, Shiga (JP); Hiroshige Kinoshita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 1401 days.

(21) Appl. No.: 11/325,346

(22) Filed: Jan. 5, 2006

(65) Prior Publication Data

US 2006/0147062 A1 Jul. 6, 2006

(30) Foreign Application Priority Data

Jan. 6, 2005 (JP) .............................. 2005-001381

(51) Int. Cl.
*H04R 3/00* (2006.01)

(52) U.S. Cl. ........................ 381/113; 381/111; 381/122; 330/250

(58) Field of Classification Search .................. 381/95, 381/120, 122, 111–115, 57; 330/250, 259, 330/270, 290
See application file for complete search history.

(56) References Cited

U.S. PATENT DOCUMENTS

| | | | | |
|---|---|---|---|---|
| 4,617,555 | A * | 10/1986 | Sheiman ..................... | 340/531 |
| 5,239,579 | A * | 8/1993 | Schuh ......................... | 379/395 |
| 6,195,437 | B1 * | 2/2001 | Markow et al. ............... | 381/93 |
| 7,003,127 | B1 * | 2/2006 | Sjursen et al. .............. | 381/322 |
| 7,391,873 | B2 * | 6/2008 | Deruginsky et al. ......... | 381/113 |
| 7,634,096 | B2 * | 12/2009 | Fallesen ..................... | 381/113 |
| 2006/0008097 | A1 * | 1/2006 | Stenberg et al. ............. | 381/113 |
| 2008/0002841 | A1 * | 1/2008 | Baker et al. ................. | 381/113 |

FOREIGN PATENT DOCUMENTS

| | | |
|---|---|---|
| JP | 63-24789 A | 2/1988 |
| JP | 64-4720 B2 | 1/1989 |

OTHER PUBLICATIONS

Koubakutosho Ltd. "PA Audio-Communication System," 1996.

* cited by examiner

*Primary Examiner*—Xu Mei
*Assistant Examiner*—Jason R Kurr
(74) *Attorney, Agent, or Firm*—Sughrue Mion, PLLC

(57) ABSTRACT

A voltage supply circuit includes a booster outputting a voltage boosted from a power supply voltage and an amplifier operating with a voltage output from the booster as a power supply and supplying a bias voltage to a sensor. An output voltage value of the booster that generates a power supply voltage of the amplifier is set according to a signal for specifying a sensitivity of the sensor.

25 Claims, 6 Drawing Sheets

VOLTAGE SUPPLY CIRCUIT AND MICROPHONE UNIT

BACKGROUND OF THE INVENTION

1. Field of the Invention

The present invention relates to voltage supply circuits and, particularly, to a voltage supply circuit for supplying a voltage to a sensor such as a capacitor microphone, and a microphone unit using the same.

2. Description of Related Art

Technology that uses a microphone called a capacitor microphone for audio communication in mobile terminals such as cell phones is widely used. The capacitor microphone is a microphone which is formed of a capacitor whose one electrode is a diaphragm and which perceives the vibration of a sound or the like as a change in capacitance and converts it into an electric signal.

"PA Audio-communication System" (Kougakutosho Ltd., 1996) describes a normal capacitor microphone system. FIG. 6 shows a circuit of a capacitor microphone unit 100 that uses the capacitor microphone. As shown in FIG. 6, the conventional capacitor microphone unit includes a capacitor microphone 101, a junction field-effect transistor (JFET) 102, a capacitor 103, resistors 104 and 105, and DC power supplies 106 and 108.

The capacitor microphone 101 is a vibration sensor that receives a sound pressure such as a sound and generates an output signal. One electrode of the capacitor microphone 101 is connected to the DC power supply 108 through the resistor 104, and the other electrode is grounded. The capacitor microphone 101 receives a specific bias voltage from the DC power supply 108. The output terminal of the capacitor microphone 101 is connected to the gate of the JFET 102. The JFET 102 is an amplifier that amplifies an output signal from the capacitor microphone 101 and generates an amplified signal. The amplified signal generated in the JFET 102 is output from the capacitor microphone unit 100 through an output terminal 107.

Though the capacitor microphone unit 100 shown in FIG. 6 uses two DC power supplies 106 and 108, it is feasible to boost the voltage supplied from the DC power supply 106 to generate a bias voltage to be supplied to the capacitor microphone 101.

Conventional techniques change the sensitivity of a capacitor microphone unit by preparing two capacitor microphone units with different sensitivity settings and switching the capacitor microphone units themselves. In this configuration, it is necessary to prepare the same number of capacitor microphone units as the number of sensitivity levels to be switched. Therefore, there has been a need for a capacitor microphone unit that allows selection between a plurality of sensitivity levels in one unit.

SUMMARY OF THE INVENTION

According to an aspect of the present invention, there is provided a voltage supply circuit that includes a booster outputting a voltage boosted from a power supply voltage and an amplifier operating with a voltage output from the booster as a power supply and supplying a bias voltage to a sensor, wherein an output voltage value of the booster is set according to a signal for specifying a sensitivity of the sensor.

According to another aspect of the present invention, there is provided a microphone unit that includes a microphone receiving a bias voltage, a booster outputting a voltage boosted from a power supply voltage, and an amplifier operating with a voltage output from the booster as a power supply and supplying a bias voltage to the microphone, wherein an output voltage value of the booster is set according to a signal for specifying a sensitivity of the microphone.

It is thereby possible to set a plurality of microphone sensitivity levels in one unit. It is also possible to reduce power consumption by setting a bias voltage value generated in a booster according to a signal for specifying a sensitivity level.

Use of the voltage supply circuit of the present invention allows implementation of a sensor unit with a plurality of sensitivity level settings in one unit.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The following embodiments take a capacitor microphone unit as an example of a microphone unit.

First Embodiment

Figure 1:
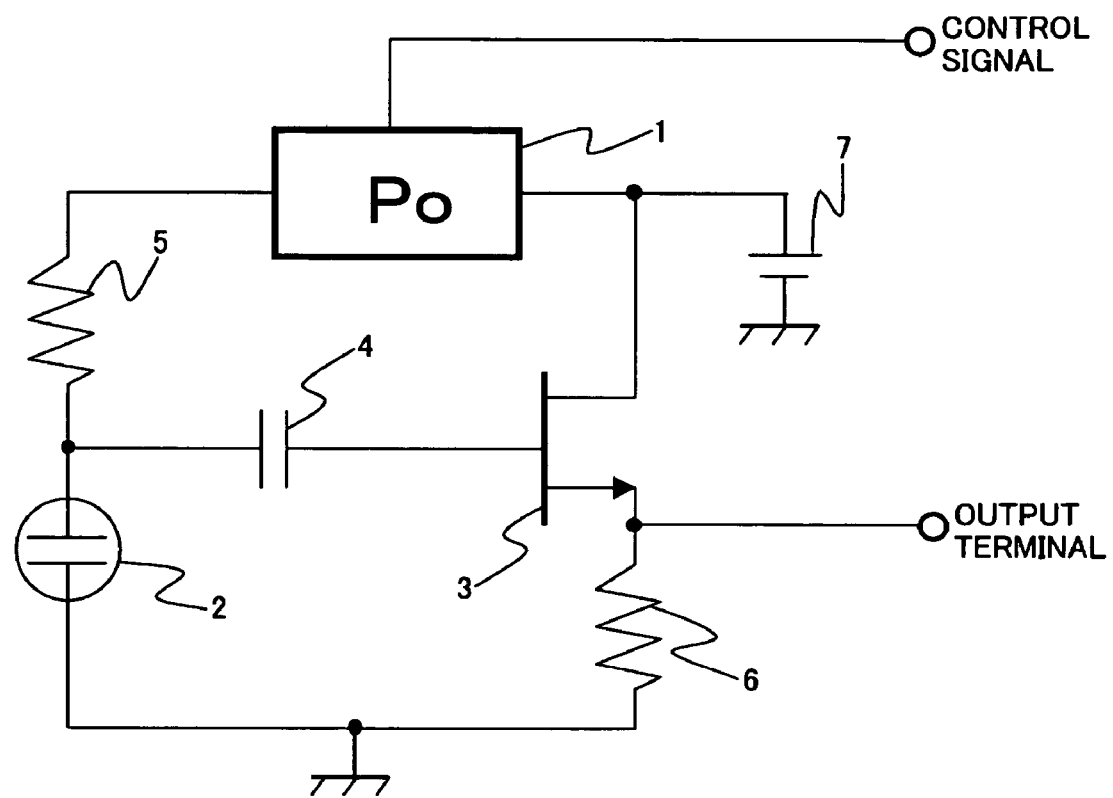
FIG. 1 is a view showing a capacitor microphone unit of the present invention.

FIG. 1 is a block diagram showing a capacitor microphone unit according to a first embodiment of the present invention. The capacitor microphone unit of the first embodiment includes a voltage supply circuit 1, a capacitor microphone 2, an amplifier 3, a capacitor 4, resistors 5 and 6, and a power supply 7.

The voltage supply circuit 1 boosts the voltage from the power supply 7 and supplies a bias voltage to the capacitor microphone 2. The bias voltage is supplied to the capacitor microphone 2 through the resistor 5. The capacitor microphone 2 is a microphone element (vibration sensor) whose one electrode is a diaphragm. The amplifier 3 is a junction field-effect transistor (JFET) that receives the output of the capacitor microphone 2 at its gate. The JFET 3 is connected between the power supply 7 and the ground.

In this capacitor microphone unit, the diaphragm of the capacitor microphone 2, which is a vibration sensor, vibrates in response to a sound or the like. Since capacitance changes when the diaphragm vibrates, a charge stored in the capacitor microphone 2 changes accordingly. Based on the change in the charge, the voltage of the node between the resistor 5 and the capacitor microphone 2 changes. The change in the voltage is supplied as an output signal of the capacitor microphone 2 to the gate electrode of the JFET 3 through the capacitor 4. The JFET 3 amplifies the output signal from the capacitor microphone 2 and outputs the amplified output signal from the node between the source of the JFET 3 and the resistor 6.

The capacitor microphone unit of the first embodiment has a high sensitive mode and a low sensitive mode. In the high sensitive mode, the capacitor microphone 2 receives a first bias voltage (e.g. about 24V) for operation; in the low sensitive mode, it receives a second bias voltage (e.g. about 12V). A mode specifying signal that sets the mode is supplied from the outside to the voltage supply circuit 1 during the operation of the capacitor microphone unit. The voltage supply circuit 1 applies the first or the second bias voltage according to the mode specifying signal to the capacitor microphone. The voltage supply circuit 1 is detailed herein.

Figure 2:
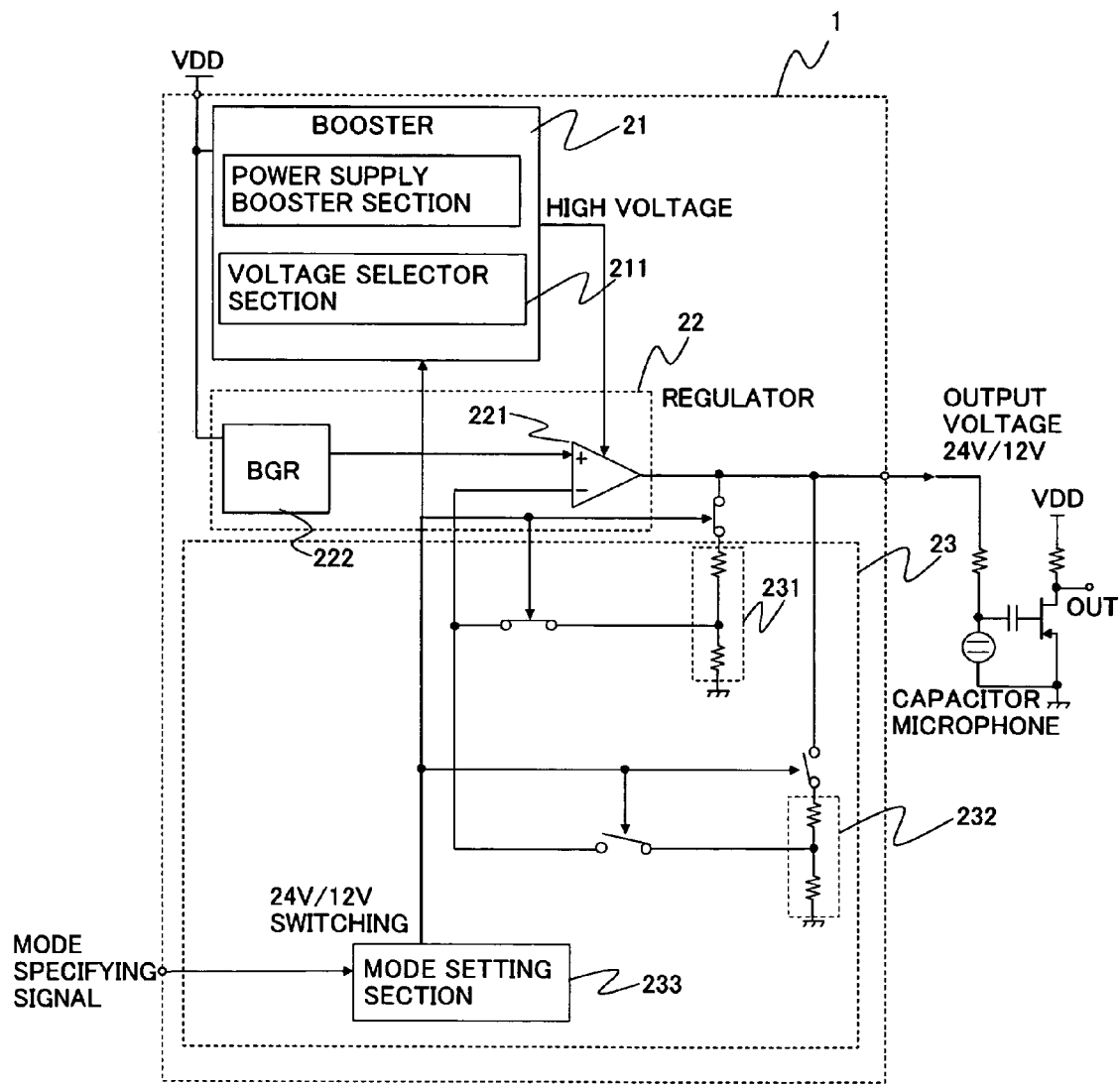
FIG. 2 is a view showing a voltage supply circuit of a capacitor microphone unit according to a first embodiment of the invention.

FIG. 2 is a block diagram showing the configuration of the voltage supply circuit 1 of the first embodiment. The voltage supply circuit 1 of the first embodiment includes a booster 21, a regulator 22, and an output voltage setting part 34. The voltage supply circuit 1 of the first embodiment does not supply a voltage boosted by the booster 21 directly to the capacitor microphone but amplifies a reference voltage by an amplifier of the regulator 22 and then supplies it to the capacitor microphone. Since the amplifier requires a high voltage power supply, the booster 21 is used.

The booster 21 boosts a voltage (e.g. 5V) supplied from the power supply 7 to a necessary voltage level (e.g. about 24V) and outputs the boosted voltage. The booster 21 has a power supply booster section and a voltage selector section. The booster 21 is detailed later.

The regulator 22 generates a bias voltage to be output from the voltage supply circuit 1. The regulator 22 has a reference voltage supply 222 and a noninverting amplifier 221. The reference voltage supply 222, which may be a band gap voltage supply (BGR) for example, generates and supplies a stable fixed voltage from the voltage of the power supply 7. The noninverting amplifier 221 operates with the voltage generated in the booster 21 as a power supply voltage. The noninverting input terminal of the noninverting amplifier 221 receives a stable reference voltage from the BGR 222 and the inverting input terminal receives a feedback input through a feedback resistor. A resistance value of the feedback resistor is set by the output voltage setting part 23, which is detailed later.

The noninverting amplifier 221 amplifies the voltage supplied to its noninverting input terminal and outputs it as a bias voltage. An amplification degree is determined by a resistance value of the feedback resistor. To be exact, it is determined by a ratio of the resistance of the feedback resistor and resistance of a resistor connected between the noninverting input terminal of the noninverting amplifier 221 and the ground. Thus, the bias voltage output from the voltage supply circuit 1 is set by a feedback resistance value of the output voltage setting part 23.

The output voltage setting part 23 sets the bias voltage to be output from the regulator 22. The output voltage setting part 23 makes the settings of the bias voltage by changing a feedback resistance value to the amplifier 221. The output-voltage setting part 23 has a first feedback resistor 231, a second feedback resistor 232, and a mode setting section 233. The first feedback resistor 231 is used during the high sensitivity mode, and the second feedback resistor 232 is used during the low sensitivity mode. The output voltage setting part 23 selectively uses the first or the second feedback resistor according to a mode specifying signal, thereby switching between the high sensitivity mode and the low sensitivity mode. The mode setting section 233 receives a mode specifying signal and outputs a switch control signal for selectively connecting either the first feedback resistor 231 or the second feedback resistor 232 to the amplifier 221.

In the voltage supply circuit 1 of the first embodiment, the BGR 222 generates a reference voltage based on the voltage supplied from the power supply 7. The reference voltage is amplified by the noninverting amplifier 221 and output as a bias voltage. At this time, the output voltage setting part 23 receives a mode specifying signal and selects either the first feedback resistor 231 or the second feedback resistor 232. The power required for the noninverting amplifier 221 to output an amplified voltage is generated by the booster 21. The voltage supply circuit 1 of this configuration allows generation of bias voltages for the high sensitivity mode and the low sensitivity mode, and the capacitor microphone unit operates therewith.

Figure 3:
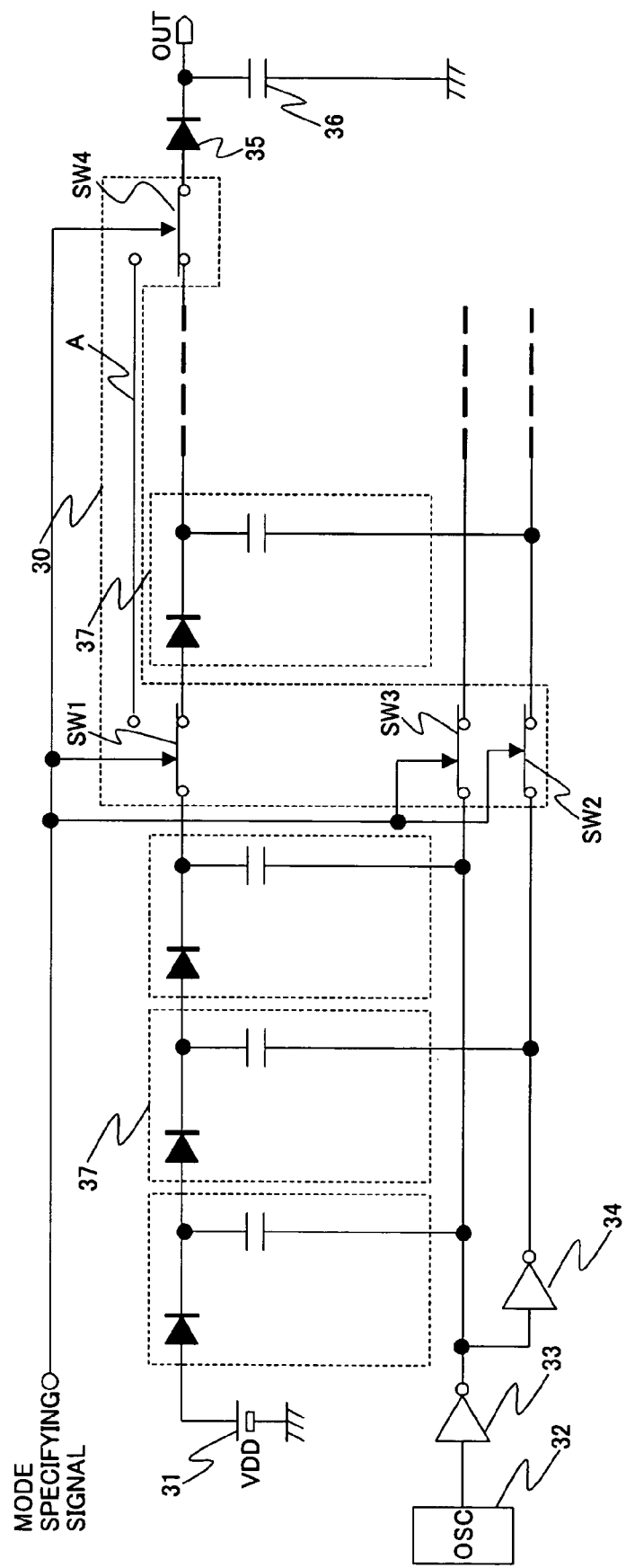
FIG. 3 is a view showing a charge pump according to a first embodiment of the invention.

The booster 21 in the voltage supply circuit 1 is described in detail herein. FIG. 3 shows a charge pump, which serves as a power supply booster section, in the booster 21 used in the first embodiment. The first embodiment places switches, which serve as a voltage selector section, in the middle stage of the charge pump. The switches operate according to the mode specifying signal. By switching this switch, the charge pump generates a power supply voltage that is required for the amplifier 221 according to the operation mode of the capacitor microphone unit.

The charge pump shown in FIG. 3 outputs a voltage value that is an integral multiple of a voltage value obtained by subtracting a forward voltage (e.g. 0.7V) of a diode from a power supply voltage (VDD). The charge pump includes a voltage selector section 30, a power supply 31, a square-wave oscillator OSC 32, inverters 33 and 34, a smoothing capacitor 35, a rectifier diode 36, and a plurality of one-time boosters 37.

In the first embodiment, a combination of one diode and one capacitor is referred to as the one-time booster. One electrode of a capacitor of the one-time booster is connected to a diode that is placed in the forward direction from the power supply 31 to the capacitor. The other electrode of the capacitor is connected to the output of the inverter 33 or 34. An input terminal of the one-time booster is an anode of the diode, and an output terminal is a node between the diode and the capacitor. A control terminal of the one-time booster is an electrode of the capacitor that is connected to the output of the inverter 33 or 34.

The configuration of the charge pump shown in FIG. 3 is detailed herein. The output of the OSC 32 is connected to the inverter 33. The output of the inverter 33 is connected to the inverter 34.

The power supply 31 is connected to one electrode of the capacitor through the diode of the one-time booster in the first stage. The other electrode of the capacitor is connected to the output of the inverter 33.

The output terminal of the one-time booster in the first stage is connected to the input terminal of the one-time booster in the second stage. The control terminal of the one-time booster in the second stage is connected to the output of the inverter 34.

In this way, an input terminal of a one-time booster in an odd number stage is connected to an output terminal of a one-time booster in an even number stage. A control terminal of a one-time booster in an odd number stage is connected to the output terminal of the inverter 33. An input terminal of a one-time booster in an even number stage is connected to an output terminal of a one-time booster in an odd number stage. A control terminal of a one-time booster in an even number stage is connected to the output terminal of the inverter 34.

The charge pump is composed of one-time boosters that are connected sequentially as described above, and in the final stage where a final output is produced, a smoothing capacitor is connected to the ground through the rectifier diode 36. The degree of boosting is determined by the number of stages of one-time boosters from the first stage to the stage immediately before the final stage. The output terminal of the one-time booster in the final stage serves as a final output terminal.

The voltage supply circuit 1 of the first embodiment has a plurality of switches SW1 to SW4 and a line A as a voltage selector section 30. The first switch SW1 is placed between an output terminal of a one-time booster in the Nth stage and an input terminal of a one-time booster in the (N+1)th stage. The second switch SW2 and the third switch SW3 are placed in output lines of the inverters 33 and 34, respectively. The second switch SW2 is placed between a control terminal of a one-time booster in the (N−1)th stage and a control terminal of a one-time booster in the (N+1)th stage. The third switch SW3 is placed between a control terminal of a one-time booster in the Nth stage and a control terminal of a one-time booster in the (N+2)th stage. The fourth switch SW4 is placed between the anode of the rectifier diode 36 in the final stage of the charge pump and an output terminal of the previous stage. The line A connects between the first switch SW1 and the fourth switch SW4. The first switch SW1 is connected to either an input terminal of a one-time booster in the next stage or the line A according to a mode specifying signal. The fourth switch SW4 is connected to either an output terminal of a one-time booster in the previous stage or the line A according to a mode specifying signal. The second switch SW2 and the third switch SW3 are turned ON or OFF according to a mode specifying signal.

The operation of the booster 21 in the high sensitivity mode is described herein. During the high sensitivity mode, the first switch SW1 connects the output terminal of the one-time booster in the Nth stage to the input terminal of the one-time booster in the (N+1) stage. The second switch SW2 and the third switch SW3 are ON so that a control signal output from the inverter is supplied also to the one-time boosters in the (N+1) and subsequent stages. The fourth switch SW4 connects the anode of the rectifier diode 36 in the final stage to the output terminal of the one-time booster in the previous stage. Thus, the high sensitivity mode performs boosting by using all the one-time boosters in the charge pump.

The boosting operation of the charge pump is detailed herein. When the OSC 32 outputs High level (power supply voltage), the output of the inverter 33 becomes Low level (ground voltage). At this time, the both ends of the capacitor of the one-time booster in the first stage receive a voltage that is obtained by subtracting a forward voltage of the diode from the power supply voltage, which is 4.3V. The capacitor stores a charge according to this voltage. Then, when the OSC 32 outputs Low level, the output of the inverter 33 becomes High level, and the output of the inverter 34 becomes Low level. At this time, since the capacitor of the one-time booster in the first stage stores the charge of 4.3V, the output terminal of the one-time booster in the first stage has a voltage value that is obtained by adding 4.3V to the power supply voltage, which is 9.3V. Since the output of the inverter 34 is Low level, the both ends of the capacitor of the one-time booster in the second stage receive a voltage that is obtained by subtracting a forward voltage of the diode from 9.3V, which is 8.6V. Thus, the capacitor of the one-time booster in the second stage stores a charge of 8.6V. At this time, since the diode is connected in the reverse direction between the output terminal of the one-time booster in the first stage and the power supply, the charge stored in the capacitor does not flow into the power supply.

In the one-time boosters in the third and subsequent stages, the operation of the one-time boosters in the first and second stages is repeated. Therefore, if five stages of one-time boosters are connected before the final stage and the power supply voltage is 5V, for example, the output voltage of the charge pump is (5V−0.7V)*6=25.8V.

In the high sensitive mode, the noninverting amplifier whose power supply is the voltage output from the booster 21 generates a bias voltage to be supplied to the capacitor microphone.

Next, the operation of the booster 21 in the low sensitivity mode is described herein. During the low sensitivity mode, the booster is supplied with a signal indicating a low sensitivity mode. In the booster, the first switch SW1 connects the output terminal of the one-time booster in the Nth stage to the line A. The second switch SW2 and the third switch SW3 are OFF so that a control signal output from the inverter is not supplied to the one-time boosters in the (N+1) and subsequent stages. The fourth switch SW4 connects the input terminal of the one-time booster in the final stage to the line A. Thus, in the low sensitivity mode, the output terminal of the Nth stage is short-circuited to the input terminal of the final stage. Therefore, it performs boosting by using the one-time booster in the Nth stage. If N=2, the output voltage of the charge pump is (5V−0.7V)*3=12.9V. In the low sensitivity mode, the noninverting amplifier 221 operates with this voltage as a power supply voltage.

The configuration of the first embodiment allows applying a bias voltage in accordance with a plurality of sensitivity modes to the capacitor microphone 2. It is thereby possible to prevent an increase in circuit size or the like due to use of a plurality of capacitor microphone units.

When generating a bias voltage with the configuration of this embodiment, the amplifier 221 requires a power supply of about 24V in the high sensitivity mode and about 12V in the low sensitivity mode. Hence, the power supply of the amplifier can be set to an appropriate value by changing the voltage generated by the booster 21 with a mode specifying signal, which prevents an increase in power consumption due to the amplifier.

Further, since the bias voltage output from the power supply circuit 1 is a voltage that is amplified from the reference voltage by the noninverting amplifier, it is possible to supply a stable bias voltage with low ripple.

Second Embodiment

A second embodiment of the present invention uses a FET charge pump as the booster 21. The other configuration is the same as in the first embodiment and thus not described herein. Just like in the first embodiment, the charge pump in the second embodiment has switches that operate according to a mode specifying signal as a voltage selector section. Since the second embodiment is different form the first embodiment only in the configuration of the charge pump that serves as a voltage booster, the booster 21 is described mainly on the FET charge pump.

Figure 4:
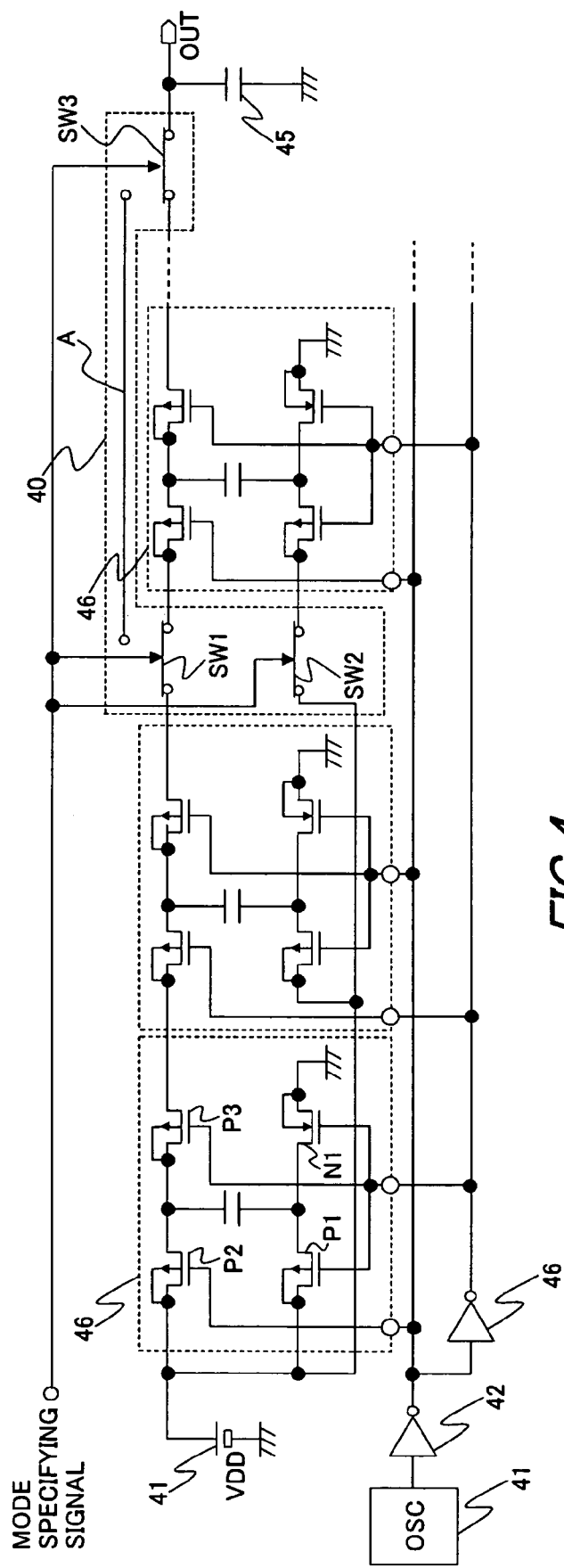
FIG. 4 is a view showing a charge pump according to a second embodiment of the invention.

FIG. 4 is a circuit diagram showing the booster 21 according to the second embodiment. The charge pump outputs a boosted voltage that is an integral multiple of a power supply voltage (VDD). The charge pump includes a voltage selector section 40, a power supply 41, a square-wave oscillator OSC 42, inverters 43 and 44, a smoothing capacitor 45, and a plurality of one-time boosters 46.

The configuration of the one-time booster of the second embodiment is described herein. The one-time booster includes an input terminal, an output terminal, a first control terminal T1, a second control terminal T2, an NMOS transistor N1, three PMOS transistors P1, P2 and P3, and a capacitor C. The NMOS transistor N1 and the PMOS transistor P1 are connected between the power supply and the ground, and the source of the first PMOS transistor P1 is connected to the power supply side and the source of the NMOS transistor N1 is connected to the ground side. The gate of the first PMOS transistor P1 is connected to the second control terminal T2, and the gate of the NMOS transistor N1 is also connected to the second control terminal T2. The drain of the first PMOS transistor P1 and the drain of the NMOS transistor N1 are connected to each other, and the node between the NMOS transistor N1 and the PMOS transistor P1 is connected to one end of the capacitor C. The other end of the capacitor C is connected to the drain of the second PMOS transistor P2 and the source of the third PMOS transistor P3. The source of the second PMOS transistor P2 is connected to the input terminal, and the gate of the same is connected to the first control terminal T1. The drain of the third PMOS transistor P3 is connected to the output terminal, and the gate of the same is connected to the second control terminal T2.

The whole configuration is described herein with reference to FIG. 4. In this charge pump, the OSC 42 is connected to the inverter 43. The output of the inverter 43 is connected to the input of the inverter 44. The input terminal of the one-time booster in the first stage is connected to the power supply. The first control terminal T1 of the one-time booster in the first stage is connected to the output of the inverter 43, and the second control terminal T2 is connected to the output of the inverter 44. The output terminal is connected to the input terminal of the one-time booster in the second stage. The first control terminal T1 of the one-time booster in the second stage is connected to the output of the inverter 44, and the second control terminal T2 is connected to the output of the inverter 43. In the third and subsequent stages, the connection of the one-time booster in the first stage and the one-time booster in the second stage is repeated. Thus, a first control terminal of a one-time booster in an odd stage is connected to the output of the inverter 43, and a second control terminal is connected to the output of the inverter 44. A first control terminal of a one-time booster in an even stage is connected to the output of the inverter 44, and a second control terminal is connected to the output of the inverter 43. Further, the smoothing capacitor 46 is connected between the output of the one-time booster in the final stage and the ground.

The voltage supply circuit 1 of the second embodiment has a plurality of switches SW1 to SW3 and a line A as a voltage selector section 40. The first switch SW1 is placed between an output terminal of a one-time booster in the Nth stage and an input terminal of a one-time booster in the (N+1)th stage. The second switch SW2 is placed between the power supply and the source of the first PMOS transistor of the one-time booster. The third switch SW3 is connected between the input terminal of the final stage and the output terminal of the previous stage in the charge pump. The line connects between the first switch SW1 and the third switch SW3. The first switch SW1 is connected to either the one-time booster in the next stage or the line A according to a mode specifying signal. The third swith SW3 is connected to either the output terminal of a one-time booster in the previous stage or the line A according to a mode specifying signal. The second switch SW2 is turned ON or OFF according to a mode specifying signal.

In the second embodiment, the switches SW1 and SW3 select the input terminal of the next stage and the output terminal of the previous stage, respectively, during the high sensitivity mode while they select the line A during the low sensitivity mode, which is the same as in the first embodiment. The switch SW2 is ON in the high sensitivity mode and OFF in the low sensitivity mode. Since the second embodiment is the same as the first embodiment in selecting an output voltage by changing the number of stages of one-time boosters to be used in the charge pump, the operation of the charge pump only is described herein. When the OSC 42 outputs High level (power supply voltage: 5V), the output of the inverter 43 is Low level (ground voltage: 0V) and the output of the inverter 44 is High level. The operation of the one-time booster in the first stage at this time is as follows. The first PMOS transistor P1 is OFF, and the NMOS transistor N1 is ON. Thus, the voltage of the node between the first PMOS transistor P1 and the NMOS transistor N1 is Low level. Further, the second PMOS transistor P2 is ON and the third PMOS transistor P3 is OFF. Thus, the voltage of the node between the second PMOS transistor P2 and the third PMOS transistor P3 is a power supply voltage level. At this time, the same voltage as the power supply voltage, which is 5V, is applied to the both ends of the capacitor so that the capacitor stores a charge corresponding to the power supply voltage.

On the other hand, when the OSC 42 outputs Low level, the output of the inverter 43 is High level, and the output of the inverter 44 is Low level. In the one-time booster in the first stage, the first PMOS transistor P1 is ON, and the NMOS transistor N1 is OFF. Thus, the voltage of the node between the first PMOS transistor P1 and the NMOS transistor N1 is a power supply voltage level (5V). The second PMOS transistor P2 is OFF and the third PMOS transistor P3 is ON. At this time, the capacitor stores a charge corresponding to 5V from the above operation. Thus, the both ends of the capacitor have a voltage of 5V. Therefore, the voltage of the node between the second PMOS transistor P2 and the third PMOS transistor P3 is a value obtained by adding the voltage between the first PMOS transistor P1 and the NMOS transistor N1 to 5V. Thus, a voltage of 10V is generated between the ground and the output terminal of the one-time booster in the first stage.

The operation of the one-time booster in the second stage is described herein. The first PMOS transistor P1 is OFF, and the NMOS transistor N1 is ON. Thus, the voltage of the node between the first PMOS transistor P1 and the NMOS transistor N1 is a ground level. The second PMOS transistor P2 is ON, and the third PMOS transistor P3 is OFF. Due to this state and the operation of the one-time booster in the first stage described above, a voltage of 10V is applied to the both ends of the capacitor of the one-time booster in the second stage. In other words, a capacitor of a one-time booster in the (N+2)th stage stores a charge corresponding to a voltage of 10V.

In one-time boosters in the third and subsequent stages, the operation of the first and second one-time boosters is repeated.

The second embodiment generates a power supply voltage that is required for the amplifier in the high sensitivity mode by using four stages of one-time boosters during the high sensitivity mode, for example. During the low sensitivity mode, it generates a power supply voltage that is required for the amplifier in the low sensitivity mode by inserting the switches SW1 and SW2 between the one-time boosters of the second stage and the third stage, for example.

This configuration allows changing the sensitivity settings of the capacitor microphone unit without switching the capacitor microphone unit itself as is the case with the first embodiment. Further, selecting between two kinds of voltages corresponding to high sensitivity and low sensitivity allows setting a power supply of an amplifier to an appropriate value, thereby suppressing an increase in power consumption due to the amplifier. Furthermore, since this embodiment uses FET, a voltage drop of 0.7V in each stage due to a diode does not occur unlike the first embodiment, and the output voltage of the booster 21 is substantially a value of the power supply voltage times the number of stages. This embodiment is thus particularly effective when a power supply voltage is low.

Third Embodiment

A third embodiment of the present invention uses a DC/DC converter as the booster 21. Since the other configuration is the same as in the first embodiment, the following description describes the booster 21 only. This embodiment uses a switch to change input resistance according to a mode specifying signal as a voltage selector section.

Figure 5:
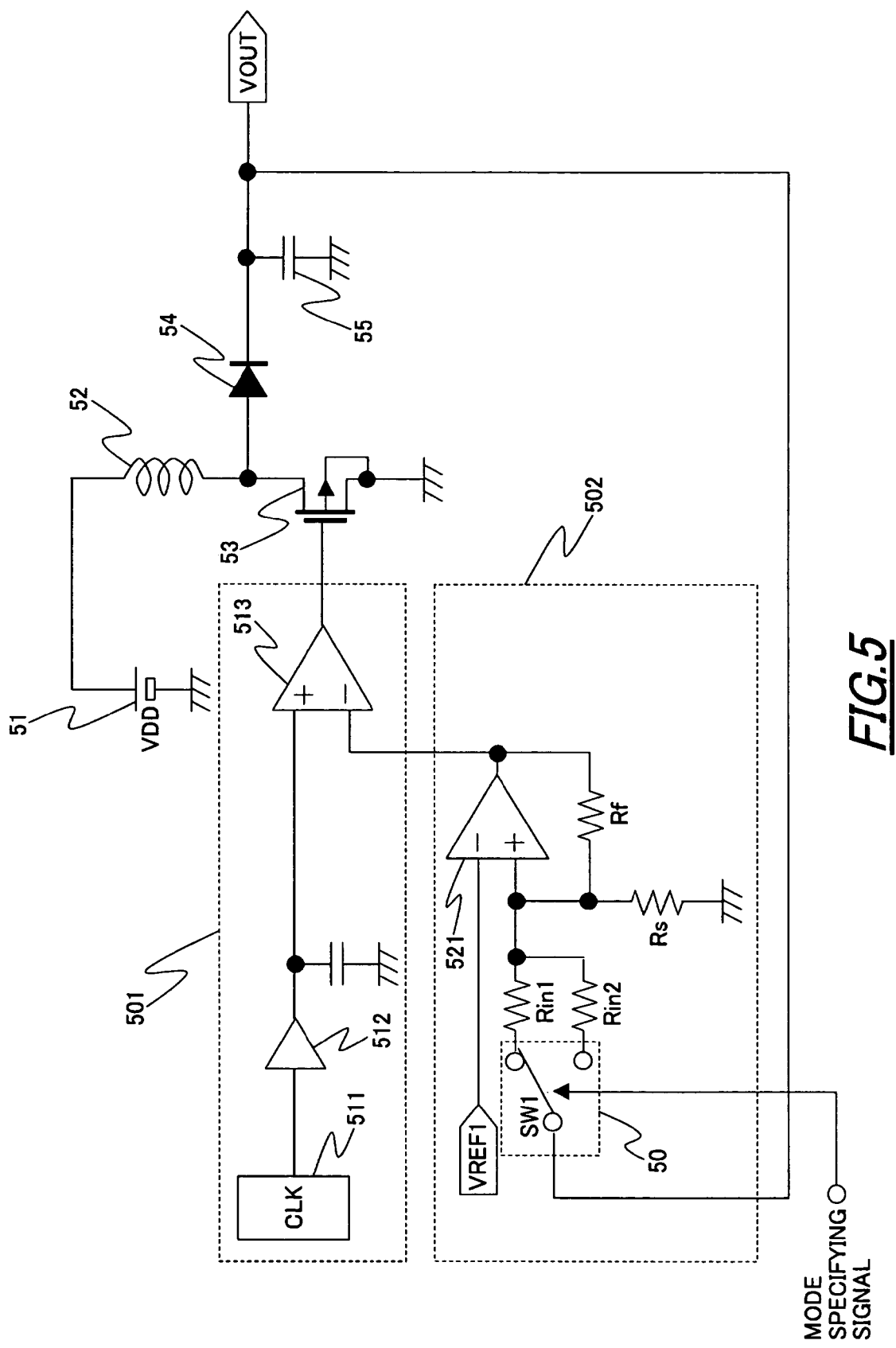
FIG. 5 is a view showing a DC/DC converter according to a third embodiment of the invention.
Figure 6:
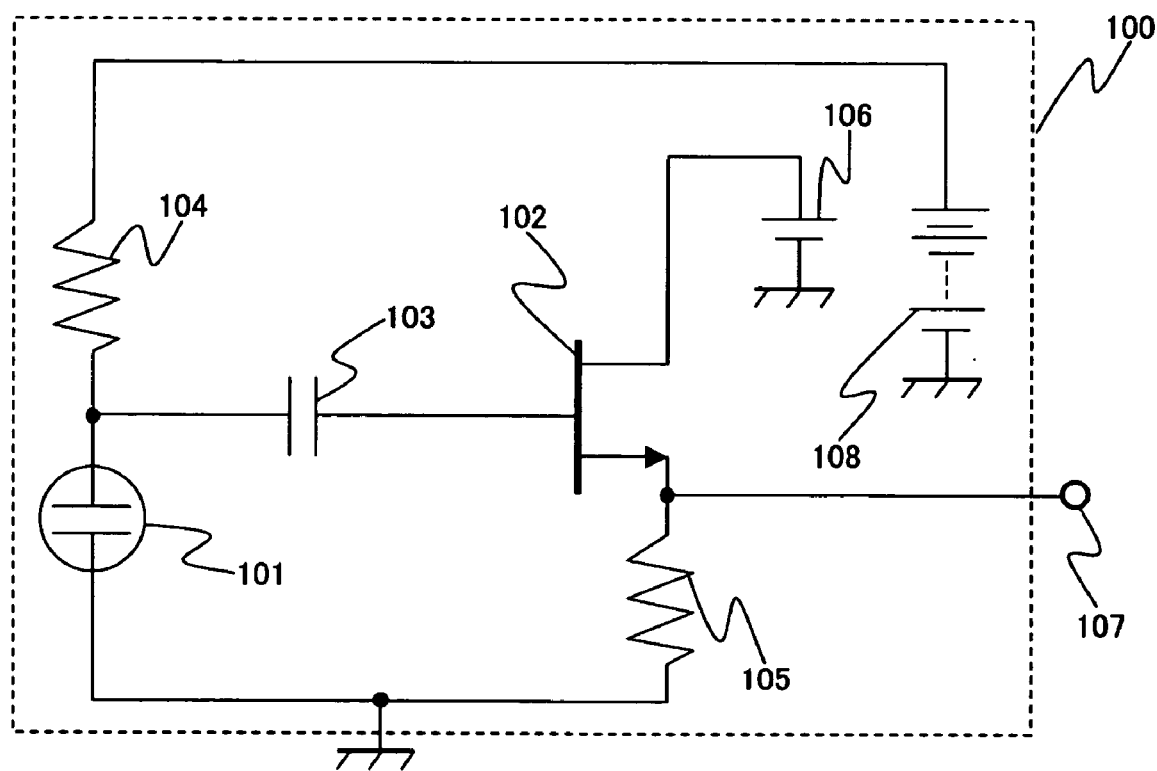
FIG. 6 is a view showing a conventional capacitor microphone unit.

FIG. 5 is a circuit diagram showing the booster 21 of the third embodiment. The DC/DC converter is a circuit that boosts a given voltage and outputs a boosted voltage. The DC/DC converter includes a pulse generator 501, an output voltage detector 502, a power supply 51, a coil 52, a switching transistor 53, a rectifier diode 54, and a smoothing capacitor 55.

The connection of the DC/DC converter is described herein. The connection of the pulse generator 501 is as follows. The pulse generator 501 includes a clock generator 511, a buffer 512, a capacitor and a comparator 513. The clock generator 511 is connected to the buffer 512. The capacitor is connected between the output of the buffer 512 and the ground, and the node between them is connected to the positive (+) terminal of the comparator 513. The negative (−) terminal of the comparator 513 is connected to the output of the output voltage detector 502, which is detailed later. The output of the comparator 513 is the output of the pulse generator 501.

The connection of the output voltage detector 502 is as follows. A stable internal reference voltage VREF1 that is generated inside is connected to the negative (−) terminal of an operational amplifier 521. The positive (+) terminal of the operational amplifier 521 is connected to input resistors Rin1 and Rin2, and feedback resistors Rs and Rf. A switch SW1 that serves as a voltage selector section 50 is placed between the output of the DC/DC converter and the input resistors Rin1, Rin2. The switch SW1 selects one from the input resistors Rin1 and Rin2 and connects the selected one to the positive (+) terminal of the operational amplifier 521. The feedback resistor Rs is connected between the positive (+) terminal of the operational amplifier 521 and the ground, and the feedback resistor Rf is connected between the output of the operational amplifier 521 and the positive (+) terminal. The output of the operational amplifier 521 is connected as the output of the output voltage detector 502 to the negative (−) terminal of the comparator 513 in the pulse generator 501.

The entire connection of the DC/DC converter is described herein. The output of the pulse generator 501 is connected to the gate of the switching transistor 53. The source of the switching transistor 53 is connected to the ground, and the drain is connected to one end of the coil 52. The other end of the coil 52 is connected to the power supply. The node between the coil 52 and the drain of the switching transistor 53 is connected to the anode of the rectifier diode 54. The capacitor is connected between the cathode of the rectifier diode 54 and the ground, and the node between the rectifier diode and the capacitor serves as the output terminal of the DC/DC converter. The output of the DC/DC converter is connected to one end of the input resistor Rin in the output voltage detector 502. The output of the output voltage detector 502 is connected to the negative (−) terminal of the comparator 513 in the pulse generator 501.

The operation of the DC/DC converter is described herein. The DC/DC converter switches between ON state (conducting state) and OFF state (nonconducting state) of the switching transistor 53 by a pulse that is generated in the pulse generator 501. By this switching operation, the DC/DC converter stores energy into the coil 52 during switch ON and stores the energy stored in the coil into the capacitor through the rectifier diode 54 during switch OFF. If the switch ON period is Ton and the switch OFF period is Toff, a voltage Vout at the output end of the capacitor is a value determined by: VDD*((Ton+Toff)/(Toff). A ratio of Ton and Toff is referred to herein as the duty ratio, and the duty ratio is high when Ton is larger than Toff and the duty ratio is low when Ton is smaller than Toff.

The voltage that is generated by the above operation is input to the output voltage detector 502. The output voltage detector 502 compares a value that divides the voltage Vout by the resistance of the input resistors Rin1 or Rin2 and the feedback resistor Rs with the internal reference voltage VREF1, and a difference between them is output from the output voltage detector 502.

The pulse generator 501 converts the square wave output from the clock generator 511 to a triangular wave by the buffer 512 and the capacitor. The triangular wave is compared with the output of the output voltage detector 502 described above. If a voltage value of the triangular wave is higher than an output value of the output voltage detector 502 at a given time t1, the output of the pulse generator 501 is High level (power supply voltage). If, on the other hand, a voltage value of the triangular wave is lower than an output value of the output voltage detector 502 at a given time t2, the output of the pulse generator 501 is Low level (ground voltage).

Thus, the pulse generator 501 and the output voltage detector 502 operate so as to decrease a pulse duty ratio if the output voltage of the DC/DC converter is higher than a predetermined value and increase the pulse duty ratio if the output voltage is lower than the predetermined value. The output voltage of the DC/DC converter is thereby kept constant. The output voltage value of the DC/DC converter can be adjusted by the ratio of the resistance of the input resistor Rin1 or Rin2 and the resistance of the feedback resistor Rs in the output voltage detector 502. For example, it is possible to supply a voltage according to the sensitivity of the capacitor microphone by setting the Rin1 to such a resistance value as to output a voltage required for an amplifier during high sensitivity mode and setting the Rin2 to such a resistance value as to output a voltage required for an amplifier during low sensitivity mode.

This configuration allows changing the sensitivity settings of the capacitor microphone unit without switching the capacitor microphone unit itself just like in the first embodiment. Further, selecting between two kinds of voltages corresponding to high sensitivity and low sensitivity allows setting a power supply of an amplifier to an appropriate value, thereby suppressing an increase in power consumption due to the amplifier. Furthermore, since this embodiment uses a DC/DC converter, a voltage drop of 0.7V in each stage due to a diode does not occur unlike the first embodiment. This embodiment is thus particularly effective when a power supply voltage is low just like the second embodiment.

As described in the foregoing, the voltage supply circuit of the present invention can apply an appropriate voltage according to a sensitivity level to a sensor such as a capacitor microphone. The present invention is not restricted to the configurations described in the above embodiments but may be varied in many ways.

Further, though the case where the vibration sensor (capacitor microphone) is used as a sensor in the voltage supply circuit of the present invention is described in detail in the above embodiments, the application of the voltage supply circuit of the invention is not limited to the capacitor microphone. For example, it is effective for other sound pressure sensors that operate in the similar principle as the capacitor microphone and detect a change in capacitance, such as a one using a semiconductor device. Therefore, the microphone unit of the present invention also includes a one that uses another sound pressure sensor for detecting a change in capacitance, such as the one using a semiconductor device as a microphone. Furthermore, the voltage supply circuit of the present invention is considerably effective for a vibration sensor of a change detecting type, particularly a one that detects a change in capacitance. The voltage supply circuit of the present invention is also applicable to other sensors that can change the output by a DC bias voltage, such as a temperature sensor and an optical sensor.

It is apparent that the present invention is not limited to the above embodiment that may be modified and changed without departing from the scope and spirit of the invention.

What is claimed is:

1. A voltage supply circuit comprising:
    a booster outputting a first voltage boosted from a power supply voltage; and
    an amplifier operating with the first voltage output from the booster as a power supply and supplying a bias voltage to a sensor unit,
    wherein a value of the first voltage output by the booster is set according to a control signal, and the bias voltage controls a sensitivity of the sensor unit.

2. The voltage supply circuit according to claim 1, wherein the booster comprises:
    a power supply booster section boosting the power, supply voltage to output the first voltage; and
    a voltage selector section configuring the power supply booster section to output the first voltage, in response to the control signal.

3. The voltage supply circuit according to claim 2, further comprising:
    a feedback resistor for the amplifier, wherein the bias voltage supplied by the amplifier is based on a resistance value of the feedback resistor.

4. The voltage supply circuit according to claim 3, wherein the resistance value of the feedback resistor is determined according to the control signal.

5. The voltage supply circuit according to claim 3, wherein the feedback resistor includes at least a first feedback resistor section and a second feedback resistor section and one of the first feedback resistor section and the second feedback resistor section is selected as the feedback resistor for the amplifier according to the control signal.

6. The voltage supply circuit according to claim 1, further comprising:
    a feedback resistor for the amplifier, wherein the bias voltage supplied by the amplifier is based on a resistance value of the feedback resistor.

7. The voltage supply circuit according to claim 6, wherein the resistance value of the feedback resistor is determined according to the control signal.

8. The voltage supply circuit according to claim 6, wherein the feedback resistor includes at least a first feedback resistor section and a second feedback resistor section and one of the first feedback resistor section and the second feedback resistor section is selected as the feedback resistor for the amplifier according to the control signal.

9. A microphone unit comprising:
    a microphone receiving a bias voltage;
    a booster outputting a first voltage boosted from a power supply voltage; and
    an amplifier operating with the first voltage output from the booster as a power supply and supplying the bias voltage to the microphone,
    wherein a value of the first voltage output by the booster is set according to a control signal, and the bias voltage controls a sensitivity of the microphone.

10. The microphone unit according to claim 9, wherein the booster comprises:
    a power supply booster section boosting the power supply voltage to output the first voltage, and
    a voltage selector section configuring the power supply booster section to output the first voltage, in response to the control signal.

11. The microphone unit according to claim 10, further comprising:
    a feedback resistor for the amplifier, wherein the bias voltage supplied by the amplifier is based on, a resistance value of the feedback resistor.

12. The microphone unit according to claim 9, further comprising:
    a feedback resistor for the amplifier, wherein the bias voltage supplied by the amplifier is based on a resistance value of the feedback resistor.

13. The microphone unit according to claim 12, wherein the resistance value of the feedback resistor is determined according to the control signal.

14. The microphone unit according to claim 12, wherein the feedback resistor includes at least a first feedback resistor section and a second feedback resistor section and one of the first feedback resistor section and the second feedback resistor section is selected as the feedback resistor for the amplifier according to the control signal.

15. A voltage supply circuit comprising:
    a setting circuit setting a bias voltage to be supplied to a sensor unit in accordance with a control signal, wherein the setting circuit comprises:
    a booster configured to output a first voltage from among a plurality of voltages in accordance with the control signal;
    an amplifier configured to supply the bias voltage to the sensor unit, and using the first voltage output from the booster as a power supply; and
    a mode setting unit configured to output the control signal for facilitating the outputting of the first voltage by the booster from among the plurality of voltages,
    wherein the bias voltage is operable to control a sensitivity of the sensor unit.

16. The voltage supply circuit according to claim 15, wherein the setting circuit further comprises:
    a reference voltage generation circuit generating a stable fixed voltage and supplying it to a first input terminal of the amplifier.

17. The voltage supply circuit according to claim 16, wherein the setting circuit further comprises:
a feedback resistor controlling a gain of the amplifier.

18. The voltage supply circuit according to claim 17, wherein the setting circuit comprises:
the feedback resistor is connected between a second input terminal of the amplifier and an output terminal of the amplifier.

19. The voltage supply circuit according to claim 17, wherein the feedback resistor at least includes a first feedback resistor section and a second feedback resistor section and one of the first feedback resistor section and the second feedback resistor section is selected as the feedback resistor for the amplifier based on the control signal.

20. The voltage supply circuit according to claim 16, wherein the reference voltage generation circuit is a band gap circuit.

21. The voltage supply circuit according to claim 15, wherein the sensor unit comprises:
a capacitor microphone receiving the bias voltage to one terminal thereof and another terminal thereof connected to a first power supply line.

22. The voltage supply circuit according to claim 21, wherein the sensor unit further comprises:
a transistor connected between the first power supply line and a second power supply line; and
a capacitor connected between a control terminal of the transistor and the one terminal of the capacitor microphone.

23. The voltage supply circuit according to claim 15, wherein the booster is formed by a charge pump composed of a plurality of one-time boosters including a diode and a capacitor.

24. The voltage supply circuit according to claim 15, wherein the booster is composed of a plurality of boosters and generates a booster voltage to be the output voltage by selecting one corresponding booster from the plurality of boosters according to the control signal.

25. A voltage supply circuit comprising:
a setting circuit setting an output voltage to be supplied to a sensor unit according to a control signal for specifying a sensitivity of the sensor unit,
wherein the setting circuit comprises:
an amplifier supplying the output voltage to the sensor unit;
a booster outputting a voltage boosted from a power supply voltage and supplying the boosted voltage to the amplifier, wherein
the booster is formed by a charge pump composed of a plurality of one-time boosters including a diode and a capacitor, and
the charge pump further comprises:
an input terminal of a one-time booster in an odd number stage connected to an output terminal of a one-time booster in an even number stage;
a control terminal of the one-time booster in the odd number stage connected to an output terminal of a first inverter; an input terminal of the one-time booster in the even number stage connected to an output terminal of the one-time booster in the odd number stage;
a control terminal of the one-time booster in the even number stage connected to an output terminal of a second inverter, a first switch mounted between an output terminal of a one-time booster in an Nth stage and an input terminal of a one-time booster in an N+1th stage;
a second switch mounted between a control terminal of a one-time booster in an N−1th stage and a control terminal of a one-time booster in an Nth stage;
a third switch mounted between a control terminal of one-time booster in an Nth stage and a control terminal of one-time booster in an N+2th stage;
a fourth switch mounted between an anode terminal of rectifier diode in a final stage of the charge pump circuit and an output terminal of a previous stage thereof; and
a line connecting the first switch and the fourth switch,
wherein the first switch is connected to an input terminal of a one-time booster in a subsequent stage or the line according to a signal for specifying a sensitivity of the sensor unit,
the fourth switch is connected to an output terminal of a one-time booster in a previous stage thereof according to the signal for specifying a sensitivity of the sensor unit, and
the, second switch and the third switch perform an boosting operation by turning on and off according to the signal for
specifying a sensitivity of the sensor unit.

* * * * *